(12) United States Patent
Dubuc et al.

(10) Patent No.: US 10,707,635 B2
(45) Date of Patent: Jul. 7, 2020

(54) METHOD FOR PROVIDING A WIRE CONNECTION TO A PRINTED CIRCUIT BOARD

(71) Applicant: CURRENT LIGHTING SOLUTIONS, LLC, East Cleveland, OH (US)

(72) Inventors: Eden Dubuc, Lachine (CA); Hubert Cardinal, Lachine (CA)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 153 days.

(21) Appl. No.: 15/816,208

(22) Filed: Nov. 17, 2017

(65) Prior Publication Data

US 2018/0331484 A1 Nov. 15, 2018

Related U.S. Application Data

(60) Provisional application No. 62/506,517, filed on May 15, 2017.

(51) Int. Cl.
*H01R 43/20* (2006.01)
*H01L 25/075* (2006.01)
(Continued)

(52) U.S. Cl.
CPC ....... *H01R 43/205* (2013.01); *H01L 25/0753* (2013.01); *H01R 4/186* (2013.01);
(Continued)

(58) Field of Classification Search
CPC . H01L 21/563; H01L 21/565; H01L 21/4885; H01L 21/67121; H01L 23/13;
(Continued)

(56) References Cited

U.S. PATENT DOCUMENTS 8,188,503 B2 5/2012 Lynch et al.
8,618,659 B2 * 12/2013 Sato .................... H01L 23/3121
257/737

(Continued)

FOREIGN PATENT DOCUMENTS

CN 202884835 U 4/2013
CN 202979471 U 6/2013
(Continued)

OTHER PUBLICATIONS

Extended European Search Report and Opinion issued in connection with corresponding EP Application No. 18171497.3 dated Oct. 8, 2018.

*Primary Examiner* — Carl J Arbes
(74) *Attorney, Agent, or Firm* — Buckley, Maschoff & Talwalkar LLC

(57) ABSTRACT

Provided is a method for providing a wire connection to a printed circuit board. The method includes attaching a first end of a wire at a first location on the printed circuit board and attaching a second end of the wire at a second location of the printed circuit board, to form an arched wire. The method further includes applying an encapsulant on the printed circuit board, the encapsulant forming a film through which the arched wire protrudes. Furthermore, the method includes cutting the arched wire to yield an out-of-plane wire connected to the printed circuit board.

20 Claims, 5 Drawing Sheets

(51) Int. Cl.
*H01R 43/048* (2006.01)
*H01R 4/18* (2006.01)
*H05K 3/28* (2006.01)
*H05K 3/32* (2006.01)

(52) U.S. Cl.
CPC .......... *H01R 43/048* (2013.01); *H05K 3/284* (2013.01); *H05K 3/32* (2013.01); *H05K 2201/10106* (2013.01); *H05K 2201/10287* (2013.01); *H05K 2203/0228* (2013.01)

(58) Field of Classification Search
CPC ......... H01L 23/49517; H01L 23/49811; H01L 23/5389; H01L 25/0753; H05K 3/284; H05K 3/32; H05K 2201/10106; H05K 2201/10287; H05K 2203/0228
See application file for complete search history.

(56) References Cited

U.S. PATENT DOCUMENTS

| | | | |
|---|---|---|---|
| 9,093,435 B2* | 7/2015 | Sato | H01L 23/3121 |
| 2009/0146167 A1 | 6/2009 | Allen et al. | |
| 2010/0232129 A1* | 9/2010 | Haba | G01R 31/2886 |
| | | | 361/783 |
| 2011/0013406 A1 | 1/2011 | Kuo | |
| 2011/0260945 A1 | 10/2011 | Karasawa | |
| 2012/0280386 A1 | 11/2012 | Sato et al. | |
| 2013/0203216 A1* | 8/2013 | Sato | H01L 23/3121 |
| | | | 438/107 |
| 2015/0255424 A1 | 9/2015 | Chau et al. | |

FOREIGN PATENT DOCUMENTS

| | | |
|---|---|---|
| DE | 20319650 U1 | 4/2004 |
| WO | 2005/103564 A1 | 11/2005 |

* cited by examiner

METHOD FOR PROVIDING A WIRE CONNECTION TO A PRINTED CIRCUIT BOARD

BACKGROUND

There is currently a challenge with electrical connections to a sealed light emitting diode mounted on a flexible printed circuit board. For example, light emitting diode sheets can be sold with an encapsulant applied to the sheet to seal and protecting the light emitting diodes. One typical method is to remove the encapsulant material and in order to form out-of-plane connections to the printed circuit boards, but the removal process for the encapsulant is risky, and it may cause damage to the printed circuit board while also causing unwanted removal of sealant material that protects the printed circuit board. Another typical method includes using a crimp connector to the edge of the printed circuit board, this requires the edge of the printed circuit board to have a special shape, which increases the cost of assembly.

SUMMARY

Given the aforementioned issues, the embodiments described herein allow adding wires to a light emitting diode printed circuit board assembly, especially when flexible boards are needed. For example, in the embodiments, a wire is disposed in a loop on the printed circuit board. When connecting to power source the wire can be cut and connected to the power cables. As such, the embodiments allow the use of standard tooling to connect a printed circuit board and lower the cost for connections since fewer connections are needed.

One embodiment provides a method for providing a wire connection to a printed circuit board. The method includes attaching a first end of a wire at a first location on the printed circuit board and attaching a second end of the wire at a second location of the printed circuit board, to form an arched wire. The method further includes applying an encapsulant on the printed circuit board, the encapsulant forming a film through which the arched wire protrudes. Furthermore, the method includes cutting the arched wire to yield an out-of-plane wire connected to the printed circuit board.

Another embodiment provides a method for making a wire connection to a set of printed circuit boards including a first printed circuit board and a second printed circuit board. The method includes attaching a first end of a wire at a first location on the first printed circuit board and attaching a second end of the wire at a second location on the first printed circuit board to form an arched wire. The second location may be electrically connected to the first location with an in-plane connector. The method further includes applying an encapsulant on the first printed circuit board, the encapsulant forming a film through which the arched wire protrudes. Further, the method includes cutting the arched wire to yield an out-of-plane wire connected to the first printed circuit board. Furthermore, the method includes providing an in-plane connection from one of the first location and the second location to a third location situated on the second printed circuit board.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility In the embodiments described herein, one or more wires may be added on each section of a flexible (or rigid) printed circuit board. The wire is connected on both ends like to form closed loop. All sections can be used independently. Furthermore, connecting any section to a power source will power all the other sections. One may then cut the wire loop and connect on any end to the power source. Furthermore, the embodiments allow a Daisy chain configuration where all sections can transfer power to adjacent sections. The printed circuit board may be a cuttable sheet or a tape.

Figure 1:
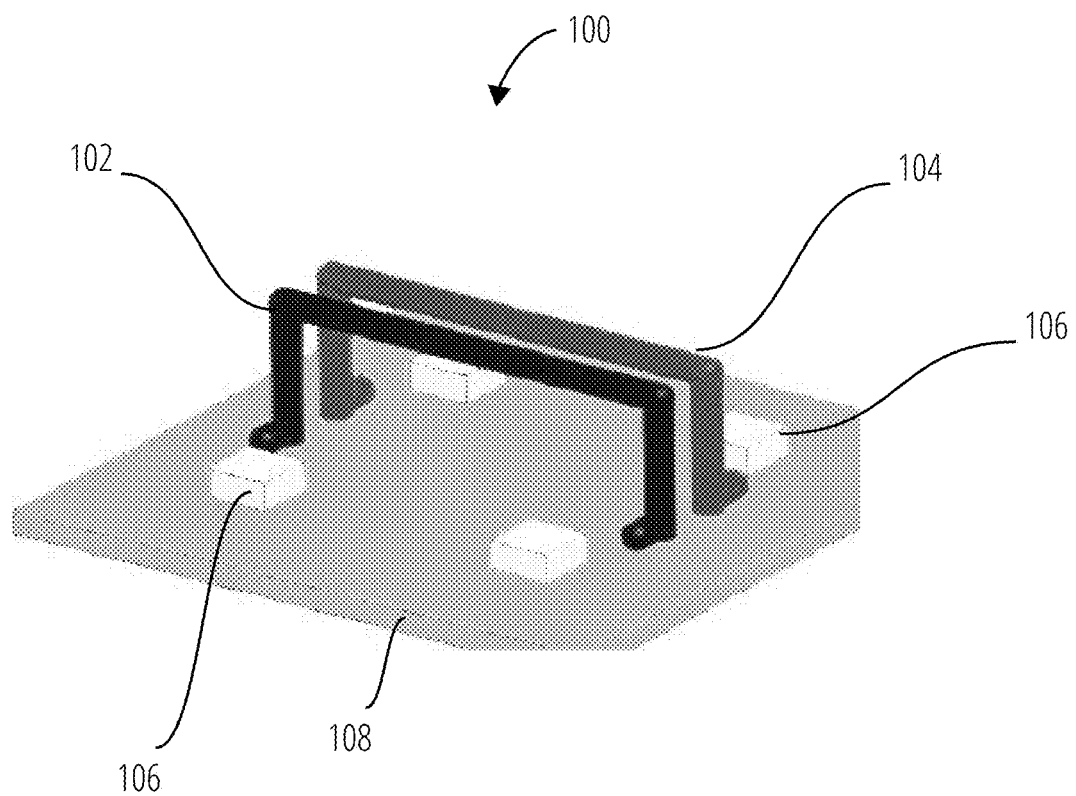
FIG. 1 illustrates a printed circuit board according to an embodiment.

FIG. 1 illustrates a printed circuit board 100 in accordance with an embodiment. The printed circuit board 100 may have a substrate 108 that is made from either a rigid printed circuit board material or a flexible printed circuit board material. Further, the printed circuit board 100 includes a plurality of light emitting diodes 106. The light emitting diodes 106 may each have a power pin and a ground pin, and all the power pins as well as the ground pins may all be common, i.e., they may be connected using an in-plane connection that is printed in a level of the printed circuit board 100. Stated otherwise, all the light emitting diodes 106 may be powered via a single connection since they have common power and ground pins.

The printed circuit board 100 further includes a set of wires (e.g., the first wire 104 and the second wire 102; specifically. Each wire forms a closed loop. Specifically, each wire is connected at one end at a first location on the printed circuit board 100 and at another end at a second location on the printed circuit board 100, thus forming a closed loop, i.e., an out-of-plane arched wire connection.

Each wire is dedicated to a specific pin of the light emitting diodes 106. For example, the first wire 104 may be connected at the power pin of a first light emitting diode at one end and at the power pin of a second light emitting diode. Similarly, the second wire 102 may be connected to the ground pin of the first light emitting diode at one end and at the ground pin of the second light emitting diode at the ground pin.

After attaching the first wire 104 and the second wire 102 to form the closed loops shown in FIG. 1, an encapsulant material may be cast onto the printed circuit board 100 to encapsulate the light emitting diodes 106. The encapsulant material may form a film such that each of the closed loops can still be accessible for cutting. In other words, the second wire 102 and the first wire 104 can still be accessible for cutting when the encapsulant material is applied onto the printed circuit board 100. Furthermore, for example, and without limitation, the encapsulant material may be a silicone or an epoxy.

Figure 2:
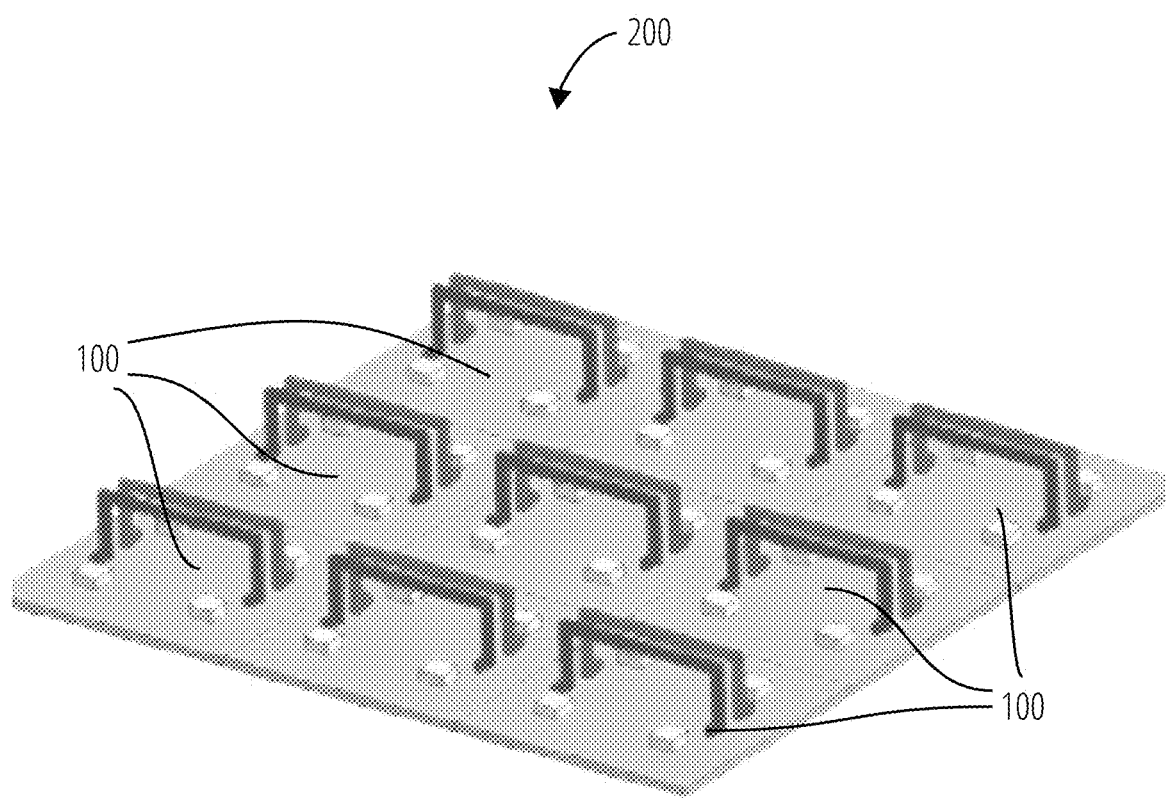
FIG. 2 illustrates an aspect of the subject matter in accordance with one embodiment.

FIG. 2 illustrates an assembly 200 of several printed circuit boards like the printed circuit board 100. Each printed circuit board is configured like the printed circuit board 100, i.e., each printed circuit board in the assembly 200 includes a first wire 104 and a second wire 102. Furthermore, in each printed circuit board in the printed circuit board 100, the first wire 104 corresponds to the same pin, i.e., either power or ground. Similarly, the second wire 102 corresponds to the same pin.

In the assembly 200, only one printed circuit board may be powered to deliver power to all of the other printed circuit boards in the assembly. Stated otherwise, the printed circuit boards in the assembly 200 may be configured as a Daisy chain in order to limit connections to the outside world two only two wires, i.e., the first wire 104 and the second wire 102. To function as described above, the assembly 200 can include in-plane traces on the substrate 108 that form connections between power pins of adjacent printed circuit boards. As such, once when printed circuit board is powered, all the others can be powered simultaneously.

Figure 3:
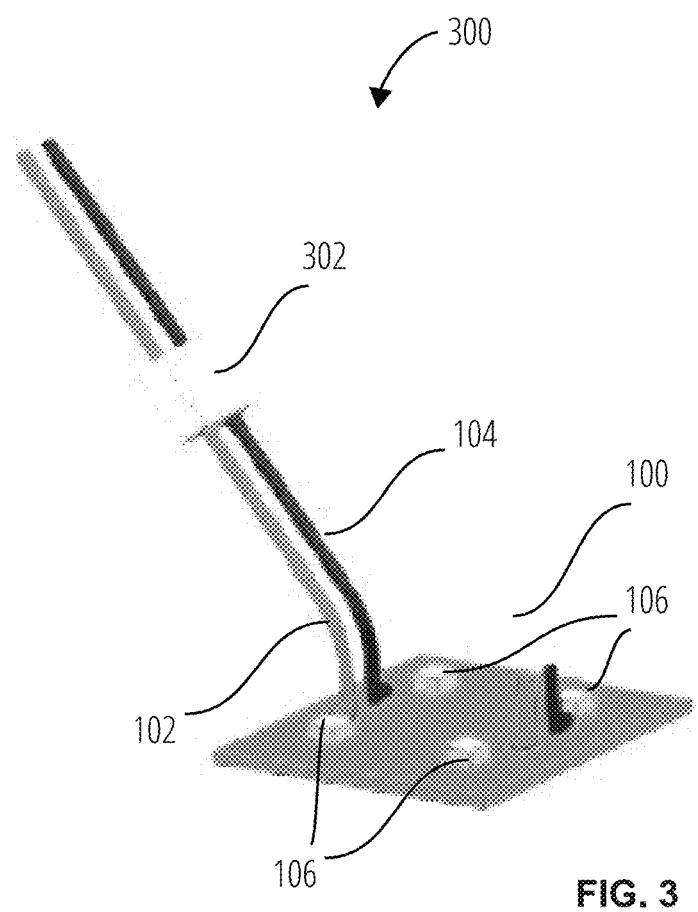
FIG. 3 illustrates a printed circuit board according to an embodiment.

FIG. 3 illustrates a view 300 of the printed circuit board 100 when the arched-wire connections formed by the first wire 104 and the second wire 102 (in FIG. 1) are cut at one extremity to release each of the wires to form an out-of-plane connector. Once the wires are cut, all the light emitting diodes 106 may still be powered even though power and ground are provided via only the two wires. This is possible because the power pin and ground pin of each of the light emitting diodes 106 are connected in-plane, correspondingly. The two wires can be interfaced with a connector 302 from which a connection to a power supply may be made. By example, and without limitation, the connector 302 may be a crimp connector.

Figure 4:
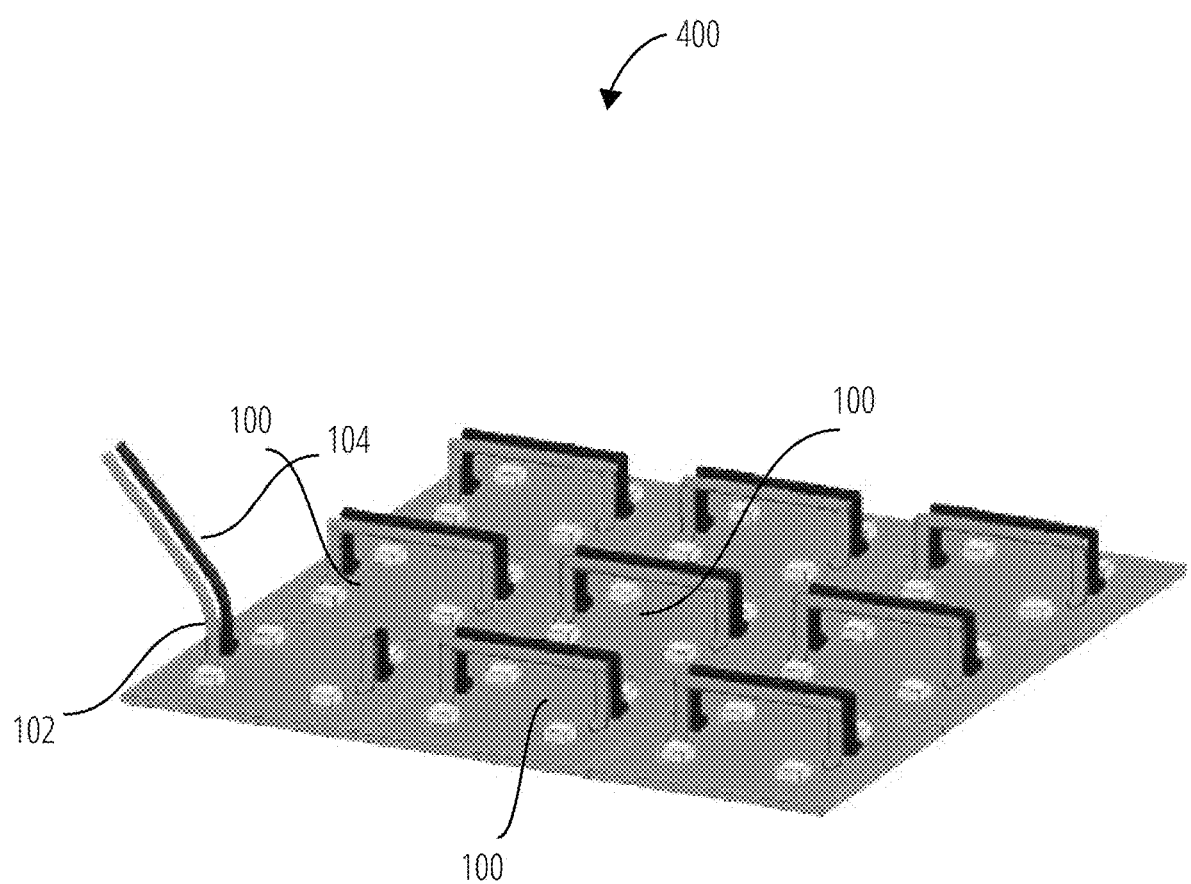
FIG. 4 illustrates a printed circuit board assembly according to an embodiment.

FIG. 4 illustrates a view 400 of printed circuit boards like the printed circuit board 100, after the two wires on one of the printed circuit boards are severed to form the out-of-plane connections. As shown in the view 400, all the printed circuit boards in the assembly may be powered via the first wire 104 and the second wire 102 from the first printed circuit board in the lower left corner. The closed loops from each of the printed circuit board 100 in the assembly may remain uncut. As such, the embodiments allow fewer connections to be made per printed circuit board assembly.

Figure 5:
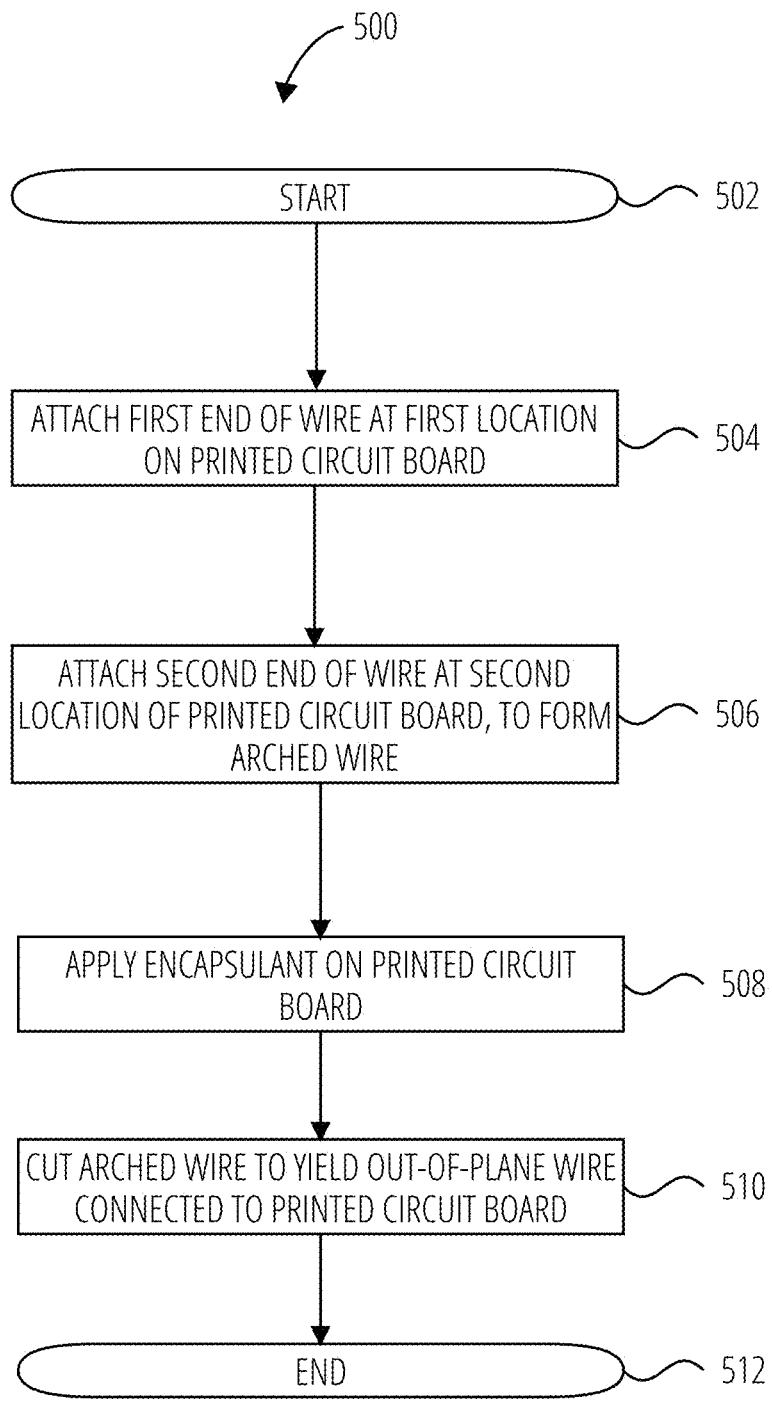
FIG. 5 illustrates a method for providing a wire connection to a printed circuit board in accordance with one embodiment.

FIG. 5 illustrates a method 500 for providing a wire connection to the printed circuit board 100 in accordance with an embodiment. The method 500 may begin at the block 502, and it can include attaching the first end of a wire at a first location on the printed circuit board 100 (block 504). The method 500 may further include attaching the second end of the wire at a second location on the printed circuit board 100 (block 506). The first and second location already be connected electrically with trace that is on the printed circuit board 100, i.e., with an in-plane connection.

After attaching the wire at both ends to form the closed loop, an encapsulant may be applied to the printed circuit board 100 and cured (block 508). The encapsulant thus forms a film that protects the printed circuit board 100 and the light emitting diodes 106 mounted thereto. The encapsulant film's height is small enough so that a substantial portion of the closed loop protrudes from the encapsulant film.

At block 510, the method 500 includes cutting the arched wire, i.e., the closed loop form by the wire to provide an out-of-plane connection to the printed circuit board 100. The method 500 may then end at the block 512.

It is noted that the method 500 may include additional steps such as applying a connector to the out-of-plane connector or assembling printed circuit boards such as the printed circuit board 100 in a daisy chain fashion.

What is claimed is:

1. A method for providing a connection of a set of wires to a printed circuit board, the method comprising:
   attaching first ends of the set of wires at a first location on the printed circuit board, wherein the set of wires comprises at least two wires;
   attaching second ends of the set of wires at a second location of the printed circuit board, to form an arched set of wires;
   applying an encapsulant on the printed circuit board, the encapsulant forming a film through which the arched set of wires protrudes; and
   cutting the arched set of wires to yield out-of-plane wires connected to the printed circuit board;
   wherein the printed circuit board includes one or more light-emitting diodes configured to receive power from the out-of-plane wires.

2. The method of claim 1, further comprising attaching a connector to the out-of-plane wires.

3. The method of claim 2, wherein the connector comprises a crimp connector.

4. The method of claim 1, wherein the first location and the second location are electrically connected via an in-plane connection disposed on the printed circuit board.

5. The method of claim 1, wherein the printed circuit board comprises a rigid printed circuit board.

6. The method of claim 1, wherein the printed circuit board comprises a flexible printed circuit board.

7. The method of claim 1, wherein the printed circuit board includes one or more light-emitting diodes configured to receive power from the out-of-plane wire.

8. The method of claim 1, wherein the encapsulant comprises an epoxy.

9. The method of claim 1, wherein the encapsulant is a silicone.

10. A method for providing a connection of a set of wires to a set of printed circuit boards including a first printed circuit board and a second printed circuit board, the method comprising:
    attaching first ends of the set of wires at a first location on the first printed circuit board, wherein the set of wires comprises at least two wires;
    attaching second ends of the set of wires at a second location on the first printed circuit board, to form an arched set of wires, the second location being electrically connected to the first location;

applying an encapsulant on the first printed circuit board, the encapsulant forming a film through which the arched set of wires protrudes;

cutting the arched set of wires to yield out-of-plane wires connected to the first printed circuit board; and providing an in-plane connection from one of the first location and the second location to a third location situated on the second printed circuit board;

wherein the printed circuit board includes one or more light-emitting diodes configured to receive power from the out-of-plane wires.

11. The method of claim 10, further comprising attaching a third printed circuit board configured to receive power from one of the first and second printed circuit boards.

12. The method of claim 11, further comprising providing power to the first printed circuit board and the second printed circuit board via the out-of-plane wires.

13. The method of claim 11, further comprising attaching a connector to the out-of-plane wires.

14. The method of claim 13, wherein the connector comprises a crimp connector.

15. The method of claim 13, wherein the first and second printed circuit boards each comprise a flexible printed circuit board.

16. The method of claim 13, wherein the first and second printed circuit boards each comprise a rigid printed circuit board.

17. The method of claim 10, wherein the first and second printed circuit boards each includes a set of light emitting diodes, and providing the power to the first printed circuit board causes each set of light emitting diodes to receive power.

18. The method of claim 10, wherein the encapsulant comprises an epoxy.

19. The method of claim 10, wherein the encapsulant comprises a silicone.

20. The method of claim 10, further comprising forming a second out-of-plane wire connection to the first printed circuit board.

* * * * *